United States Patent
Park et al.

(10) Patent No.: US 9,991,462 B2
(45) Date of Patent: Jun. 5, 2018

(54) ORGANIC LIGHT EMITTING DISPLAY DEVICE

(71) Applicant: LG Display Co., Ltd., Seoul (KR)

(72) Inventors: Jongchan Park, Paju-si (KR); ChangJae Jang, Paju-si (KR); JungChul Kim, Paju-si (KR); JaeSik Hwang, Gunpo-si (KR); Minji Han, Iksan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 15/603,115

(22) Filed: May 23, 2017

(65) Prior Publication Data

US 2018/0061918 A1    Mar. 1, 2018

(30) Foreign Application Priority Data

Aug. 31, 2016 (KR) .................. 10-2016-0112120
Dec. 27, 2016 (KR) .................. 10-2016-0179662

(51) Int. Cl.
*H01L 51/52* (2006.01)
*H01L 27/32* (2006.01)

(52) U.S. Cl.
CPC .......... *H01L 51/52* (2013.01); *H01L 27/3216* (2013.01); *H01L 27/3248* (2013.01); *H01L 27/3258* (2013.01); *H01L 51/5206* (2013.01); *H01L 51/5253* (2013.01); *H01L 2227/323* (2013.01)

(58) Field of Classification Search
None
See application file for complete search history.

(56) References Cited

U.S. PATENT DOCUMENTS

2012/0181544 A1* 7/2012 Lee ..................... H01L 27/3246
                                                              257/72
2013/0069853 A1* 3/2013 Choi ................... H01L 27/3276
                                                              345/80

* cited by examiner

*Primary Examiner* — Joseph Schoenholtz
(74) *Attorney, Agent, or Firm* — Fenwick & West LLP

(57) ABSTRACT

An organic light emitting display device is provided according to the present disclosure. An organic light emitting display device comprising a first planarization layer configured to planarize an upper portion of a circuit element on a substrate, an inorganic layer comprising a first out-gassing pattern on the first planarization layer, a second planarization layer configured to planarize an upper portion of the inorganic layer and a metal layer comprising a second out-gassing pattern on the second planarization layer.

20 Claims, 7 Drawing Sheets

ORGANIC LIGHT EMITTING DISPLAY DEVICE

CROSS REFERENCE TO RELATED APPLICATIONS

This application claims the benefit of the Korean Patent Application No. 10-2016-0112120 filed on Aug. 31, 2016 and the Korean Patent Application No. 10-2016-0179662 filed on Dec. 27, 2016, which are both hereby incorporated by reference as if fully set forth herein.

BACKGROUND

Technical Field

The present disclosure relates to an organic light emitting display device.

Related Technology

Image display devices that provide various information on the screen is regarded as a core technology of the information and communication age. Such display devices are becoming thinner, lighter, and more portable, while supporting higher performance characteristics. As one example, an organic light emitting display device for displaying an image by controlling the degree of emission of the organic light emitting element has attracted attention.

The organic light emitting display device is a self-emissive device implementing a thin light emitting layer disposed between electrodes and thus it is advantageous for manufacturing as a thin film. A general organic light emitting display has a structure in which a pixel driving circuit and an organic light emitting element are formed on a substrate, and light emitted from the organic light emitting element passes through the substrate or the barrier layer to display an image.

Since the organic light emitting display device is implemented without an additional light source, it can be easily implemented as a flexible display device. In such case, a flexible material such as plastic or metal foil can be used as a substrate of an organic light emitting display device.

Recently, the organic light emitting display device has been developed to support increased display resolution. Accordingly, the required number of signal lines has increased, but the space or footprint for arranging the signal lines has become insufficient. In such a situation, securing a sufficient space for arranging various elements such as signal lines has been regarded as an important goal. Furthermore, a method for solving various difficulties associated with a manufacturing process of the structure, while efficiently arranging various parts and elements, is being developed.

SUMMARY

An object of the present disclosure is to propose an organic light emitting diode display device and a stacked structure that can be applied to the organic light emitting diode display device. Moreover, another object of the present disclosure is to further apply a structure for effectively out-gassing to the said stacked structure. But the objects of the present disclosure are not limited to the above-mentioned objects, and the other objects not mentioned above may be clearly understood by those skilled in the art from the following description.

According to an embodiment of the present disclosure, an organic light emitting display is provided. The organic light emitting display may include: a first planarization layer configured to planarize an upper portion of a circuit element disposed on a substrate; an inorganic layer including a first out-gassing pattern on the first planarization layer; a second planarization layer configured to planarize an upper portion of the inorganic layer; and a metal layer including a second out-gassing pattern on the second planarization layer.

According to an embodiment of the present disclosure, a display device is provided. The display device includes a first planarization layer, a first layer on the planarization layer and in contact with the planarization layer, a first outgassing pattern in the first layer, the first outgassing pattern including one or more gas discharge holes, a second planarization layer covering the first layer, a second layer on the second planarization layer and in contact with the second planarization layer, and a second outgassing pattern in the second layer, the second outgassing pattern comprising one or more gas discharge holes. The first layer may comprise two or more layers including a buffer layer and a protective layer, the gas discharge holes extend through the buffer layer and the protective layer. The second layer may be a conductive material. The second layer may be in a same layer as a first electrode of an organic light emitting device. The display device may also include a metal layer on the first planarization layer, wherein the first outgassing pattern does not overlap with the metal layer. In one aspect, first outgassing pattern does not overlap with any contact holes in the first planarization layer or any contact holes in the second planarization layer. In another aspect, the first outgassing pattern does not overlap with any organic light emitting diode anodes. At least one of the first outgassing pattern and the second outgassing pattern may be in an inactive area of the display device. At least one of the first outgassing pattern and the second outgassing pattern may be in an active area of the display device. In one aspect, the second outgassing pattern does not overlap with the first outgassing pattern.

The details of other embodiments are included in the detailed description and drawings.

An organic light emitting display, adopting a residual gas exhaust structure, thereby improving the image quality deterioration problem due to residual gas, can be provided according to the embodiments of the present disclosure. More particularly, an organic light emitting display, which mitigates display quality deterioration problems due to damaged organic light emitting layer by residual gas, is provided according to the embodiments of the present disclosure. Accordingly, the organic light emitting display according to the embodiments of the present disclosure can achieve high resolution with improved display quality. The effects according to the embodiments of the present disclosure are not limited by the contents described above, and more various effects are included in the detailed description.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE PRESENT DISCLOSURE

Figure 1:
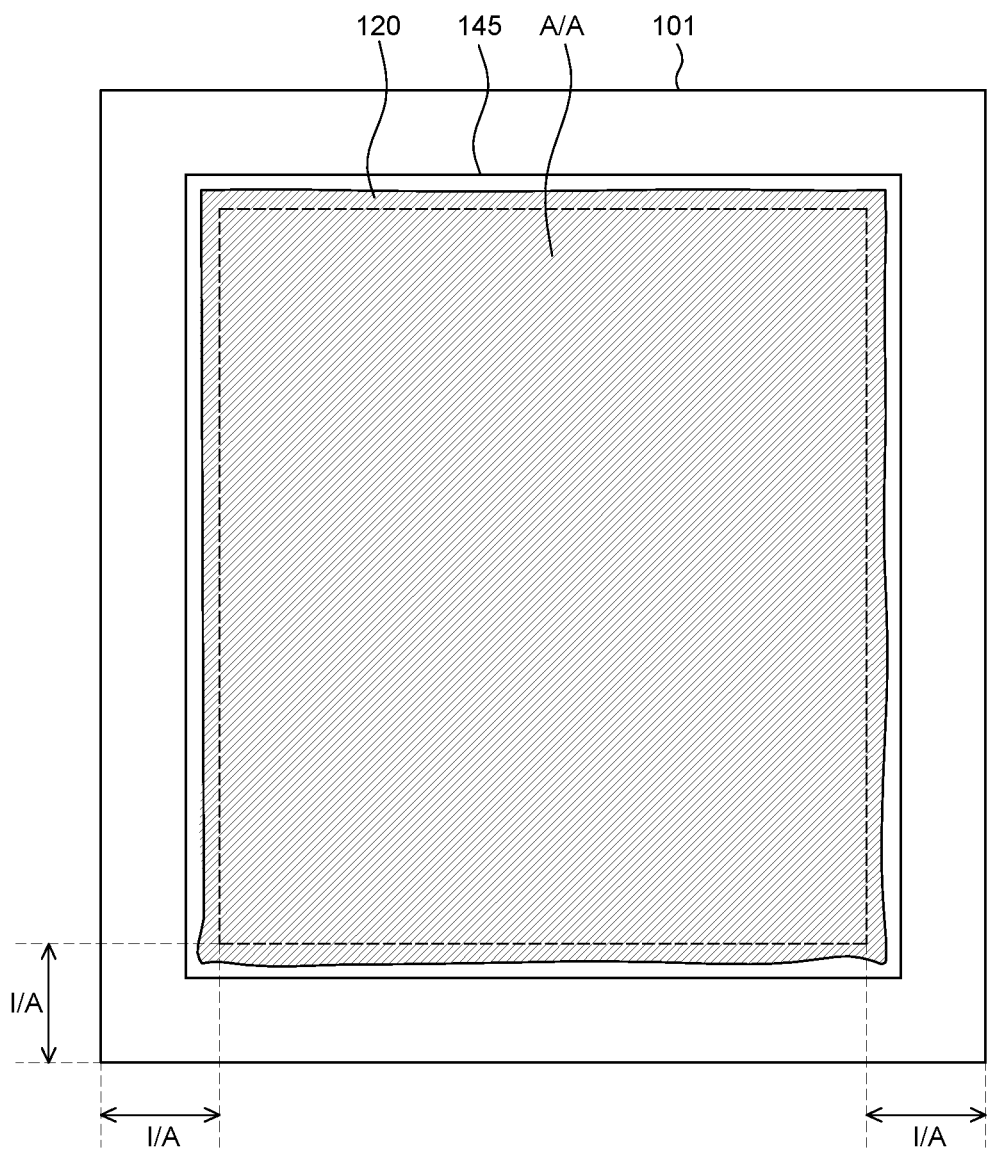
FIG. 1 is a plan view of an organic light emitting display according to an embodiment of the present disclosure.

Advantages and features of the present disclosure and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention and the present invention will be defined by the appended claims.

The shapes, sizes, ratios, angles, numbers and the like illustrated in the accompanying drawings for describing the exemplary embodiments of the present disclosure are merely examples and the present disclosure is not limited thereto. Like reference numerals generally denote like elements throughout the present specification. Further, in the following description, a detailed explanation of certain related technologies may be omitted to avoid unnecessarily obscuring the subject matter of the present disclosure. The terms such as "including", "having", "comprising" and "consist of" used herein are generally intended to allow other components to be added unless the terms are used with the term "only". Any references to singular may include plural unless expressly stated otherwise. Components are interpreted to include an ordinary error range or an ordinary tolerance range even if not expressly stated.

When the position relation between two parts is described using the terms such as "on", "above", "below" and "next", on or more parts may be positioned between the two parts unless the terms are used with the term "immediately" or "directly". When an element or layer is referred to as being "on" another element or layer, it may be directly on the other element or layer, or intervening elements or layers may be present. When an element is described as being "connected", "coupled", or "in contact with" to another element, the element may be directly connected or directly in contact with, however, it should be understood that other elements may be interposed between the elements, or each element may be "connected", "coupled", or "in contact with" by another element.

Although the terms "first", "second" and the like are used for describing various components, these components are not confined by these terms. These terms are merely used for distinguishing one component from the other components. Therefore, a first component to be mentioned below may be a second component in a technical concept of the present disclosure.

Since size and thickness of each element illustrated in the drawings are represented merely for convenience in explanation, and the present disclosure is not necessarily limited to the illustrated size and thickness of each element. Various exemplary embodiments of the present disclosure will be described in detail with reference to the accompanying drawings below.

FIG. 1 is a plan view of an organic light emitting display according to an embodiment of the present disclosure.

Referring to FIG. 1, the organic light emitting display device 100 includes at least one active area A/A, and an array of pixels is disposed in the active area. At least one inactive area I/A may be disposed adjacent to the active area. That is, the inactive area may be adjacent to at least one side of the active area. In FIG. 1, the inactive area surrounds the active area having a rectangular shape. However, the shape of the active area, the shape and the arrangement of the inactive area adjacent to the active area are not limited to the example as illustrated in FIG. 1. The active area and the inactive area may be designed suitable for an electronic device on which the display device 100 is implemented. The exemplary shapes of the active area may be pentagonal, hexagonal, circular, oval, and the like.

Each pixel in the active area A/A may be associated with a pixel driving circuit. The pixel driving circuit may include at least one switching transistor and at least one driving transistor. Each pixel driving circuit may be electrically connected to a signal line (e.g., a gate line, a data line, and the like) for communicating with a gate driver, a data driver, and the like located in the inactive area.

The gate driver and the data driver may be formed of a thin film transistor (TFT) in the inactive area I/A. Such drivers may be referred to as gate-in-panel (GIP). In addition, some components, such as a data driver IC, may be mounted on a separate printed circuit board. The components may be coupled to a connection interface (e.g., pads, bumps, pins, and the like) disposed in the inactive area by circuit films (e.g., flexible printed circuit boards (FPCB), chip-on-film (COF), tape-carrier-package (TCP), and the like). The printed circuit (e.g., COF, PCB, and the like) may be positioned on the rear side of the display device 100.

The organic light emitting display device 100 may include various additional elements for generating various signals or driving pixels in the active area. Additional elements for driving the pixel may include an inverter circuit, a multiplexer, an electrostatic discharge circuit (ESD), and the like. The organic light emitting display device 100 may also include additional elements associated with functions other than pixel driving function.

For example, the organic light emitting diode display 100 may include additional elements for providing touch sensing function, user authentication function (e.g., fingerprint recognition), multi-level pressure sensing function, tactile feedback function, and the like. The above-mentioned additional elements may be located in the inactive area and/or an external circuit connected to the connection interface.

The organic light emitting display according to the present disclosure may include a substrate 101 on which a thin film transistor and an organic light emitting element are arranged, an encapsulation layer 120, a polarization layer 145, and the like.

The substrate 101 supports various elements of the organic light emitting diode display device 100. The substrate 101 may be formed of a transparent insulating material, for example, an insulating material such as glass, plastic, or the like. The concept of the substrate (i.e., an array substrate) may also be interpreted so as to include an element and a functional layer formed thereon, for example, a switching TFT, a driving TFT connected to the switching TFT, an organic light emitting element connected to the driving TFT, a protective layer and the like.

The organic light emitting element is disposed on the substrate 101. The organic light emitting element includes an anode, an organic light emitting layer, and a cathode. The organic light emitting element may be configured as a single light emitting layer structure so as to emit red, green or blue light or may be configured as multiple light emitting layers so as to emit a white light. When the organic light emitting element emits the white light, a color filter may further be provided to filter the white light into red green or blue light. The organic light emitting element may be formed in the central portion of the substrate 101 to correspond to the active area.

The encapsulation layer 120 may cover the organic light emitting element. The encapsulation layer protects the organic light emitting element from external moisture or oxygen.

The organic light emitting display device 100 may be configured of a plurality of pixels, and one pixel may include a plurality of sub-pixels. In such case, the sub-pixel is the minimum unit for expressing one color.

One sub-pixel may include a plurality of transistors, a capacitor, and a plurality of lines. The sub-pixel may be configured of two transistors and one capacitor (i.e., 2T1C), but it is not limited thereto and may be implemented as a sub-pixel configured of 4T1C, 7T1C, 6T2C, and the like. In addition, the sub-pixel may be implemented to be suitable for the organic light emitting display device 100 of the top emission type.

Figure 2:
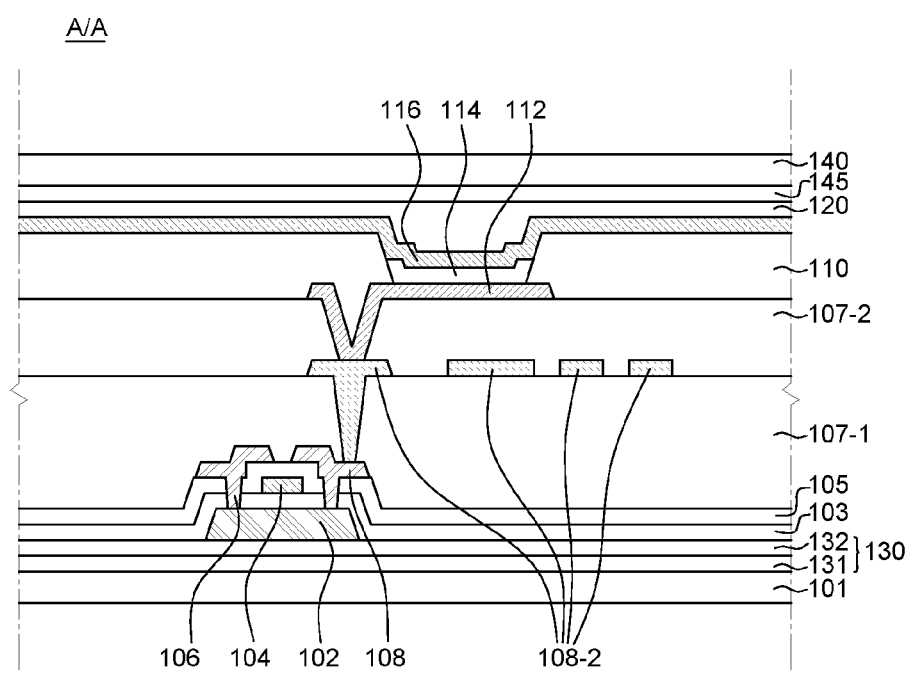
FIG. 2 is a cross-sectional view illustrating a portion of an active area of an organic light emitting display device according to an embodiment of the present disclosure.

FIG. 2 is a cross-sectional view illustrating a portion of an active area of an organic light emitting display device according to an embodiment of the present disclosure.

The organic light emitting diode display of FIG. 2 has an exemplary structure in which two planarization layers are configured. In the organic light emitting display device 100, thin film transistor elements 102, 104, 106 and 108, organic light emitting elements 112, 114 and 116 and various functional layers are disposed on a substrate (or an array substrate).

The substrate 101 may be a glass or plastic substrate. In the case of a plastic substrate, a polyimide-based material or a polycarbonate-based material may be used to have flexibility. In particular, polyimide, can be applied to a high-temperature process, is a material that can be coated, and thus is widely used as a plastic substrate.

The buffer layer 130 is a functional layer for protecting the electrode/signal line from impurities such as alkali ions or the like flowing out from the substrate 101 or lower layers. The buffer layer may be formed of silicon oxide (SiOx), silicon nitride (SiNx), or a multilayer thereof. The buffer layer 130 may include a multi-buffer 131 and/or an active buffer 132. The multi-buffer 131 may be formed by alternately stacking silicon nitride (SiNx) and silicon oxide (SiOx), and may delay diffusion of moisture and/or oxygen impregnated into the substrate 101. The active buffer 132 protects the semiconductor layer 102 of the transistor and functions to block various kinds of defects introduced from the substrate 101. The active buffer 132 may be formed of amorphous silicon (a-Si) or the like.

The thin film transistor may be in the form in which the semiconductor layer 102, the gate insulating film 103, the gate electrode 104, the interlayer insulating film 105, and the source and drain electrodes 106 and 108 are sequentially stacked. The semiconductor layer 102 is on the buffer layer 130. The semiconductor layer 102 may be made of poly-silicon (p-Si), in such case, a predetermined area may be doped with an impurity. In addition, the semiconductor layer 102 may be made of amorphous silicon (a-Si), or may be made of various organic semiconductor materials such as pentacene. Further, the semiconductor layer 102 may be made of an oxide substance. The gate insulating film 103 may be formed of an insulating inorganic material such as silicon oxide (SiOx) or silicon nitride (SiNx), or may be formed of an insulating organic material or the like. The gate electrode 104 may be formed of various conductive materials such as magnesium (Mg), aluminum (Al), nickel (Ni), chrome (Cr), molybdenum (Mo), tungsten (W) or the like.

The interlayer insulating film 105 may be formed of an insulating material such as silicon oxide (SiOx) or silicon nitride (SiNx), or may be formed of an insulating organic material or the like. A contact hole, in which the source and drain areas are exposed, may be formed by selectively removing the interlayer insulating film 105 and the gate insulating film 103.

The source and drain electrodes 106 and 108 are formed of an electrode material on the interlayer insulating film 105 as a single layer structure or a multi-layer structure. A passivation layer made of an inorganic insulating material may cover the source and drain electrodes 106 and 108 as needed.

The first planarization layer 107-1 may be on the thin film transistor. The first planarization layer 107-1 protects the thin film transistor and the like and flattens the upper portion thereof. The first planarization layer 107-1 may be formed in various shapes and may be formed of at least one material among the materials such as an acrylic resin, an epoxy resin, a phenol resin, a polyamide resin, a polyimide resin, an unsaturated polyester resin, a polyphenylene resin, and a polyphenylene sulfide-based resin, but the materials are not limited thereto. Various metal layers 108-2 serving as signal lines/electrodes may be disposed on the first planarization layer 107-1.

The second planarization layer 107-2 is on the first planarization layer 107-1. The reason why the embodiment of the present disclosure includes two planarization layers is that the number of various signal lines are increased as the display device evolves so as to realize a high resolution. Therefore, it becomes more difficult to ensure the minimum gap when arranging all the signal lines in one layer. Consequently, the additional layer is made. This additional layer (i.e., second planarization layer) may provide a sufficient margin for signal line arrangement, which makes it easier to design the layout of the signal lines/electrodes. Further, if a dielectric material is used to form the planarization layers 107-1 and 107-2, the planarization layers 107-1 and 107-2 may be configured to form a capacitance between the metal layers.

The organic light emitting element may have a structure in which the first electrode 112, the organic light emitting layer 114, and the second electrode 116 are sequentially stacked. That is, the organic light emitting element includes a first electrode 112 on the second planarization layer 107-2, an organic light emitting layer 114 on the first electrode 112, and a second electrode 116 on the organic light emitting layer 114.

The first electrode 112 may be electrically connected to the drain electrode 108 of the driving TFT through the connection electrode 108-2. When the organic light emitting display device 100 is a top emission type, the first electrode 112 may be made of an opaque conductive material having a high reflectivity. For example, the first electrode 112 may be formed of silver (Ag), aluminum (Al), gold (Au), molybdenum (Mo), tungsten (W), chromium (Cr), alloy thereof and the like.

The bank 110 may be formed in the remaining region except for the light emitting region. Accordingly, the bank 110 has a bank hole for exposing the first electrode 112 corresponding to the light emitting region. The bank 110 may be made of an inorganic insulating material such as a silicon nitride film (SiNx), a silicon oxide film (SiOx), or an organic insulating material such as BCB, acrylic-based resin or imide-based resin.

The organic light emitting layer 114 is on the first electrode 112 which is exposed by the bank 110. The organic light emitting layer 114 may include a light emitting layer, an electron injection layer, an electron transport layer, a hole transport layer, a hole injection layer, and the like. One or more of these layers may be combined into a single layer. Alternatively, one or more functionalities may be combined into a particular layer.

The second electrode 116 is on the organic light emitting layer 114. When the organic light emitting display device 100 is a top emission type, the second electrode 116 may be a transparent conductive layer such as indium tin oxide (ITO) or indium zinc oxide (IZO), thereby emitting the light generated from the organic light emitting layer 114 towards to the second electrode 116.

The encapsulation layer 120 may be on the second electrode 116. The encapsulation layer 120 is configured to prevent oxygen and moisture permeation in order to suppress oxidation of the light emitting element and the electrode. When the organic light emitting element is exposed to moisture or oxygen, a pixel shrinkage phenomenon may occur in which the light emitting region is shrunk, or a dark spot may be generated in the light emitting region. The encapsulation layer may be made of an inorganic layer made of glass, metal, aluminum oxide (AlOx) or silicon (Si) based material, or alternatively, an organic layer and an inorganic layer may be alternately stacked. The inorganic layer serves to block permeation of moisture and oxygen, and the organic film serves to provide the planarized surface for the inorganic layer. One of the reason why the encapsulation layer is formed of a plurality of thin film layers is that it makes the permeation path of water or oxygen longer and more complicated than the single layer, hence it makes penetration of moisture and oxygen into the organic light emitting element more difficult.

A touch panel (e.g., a touch film), a polarization layer 145, a cover glass 140, and the like may be further disposed on the encapsulation layer 120.

Figure 3A:
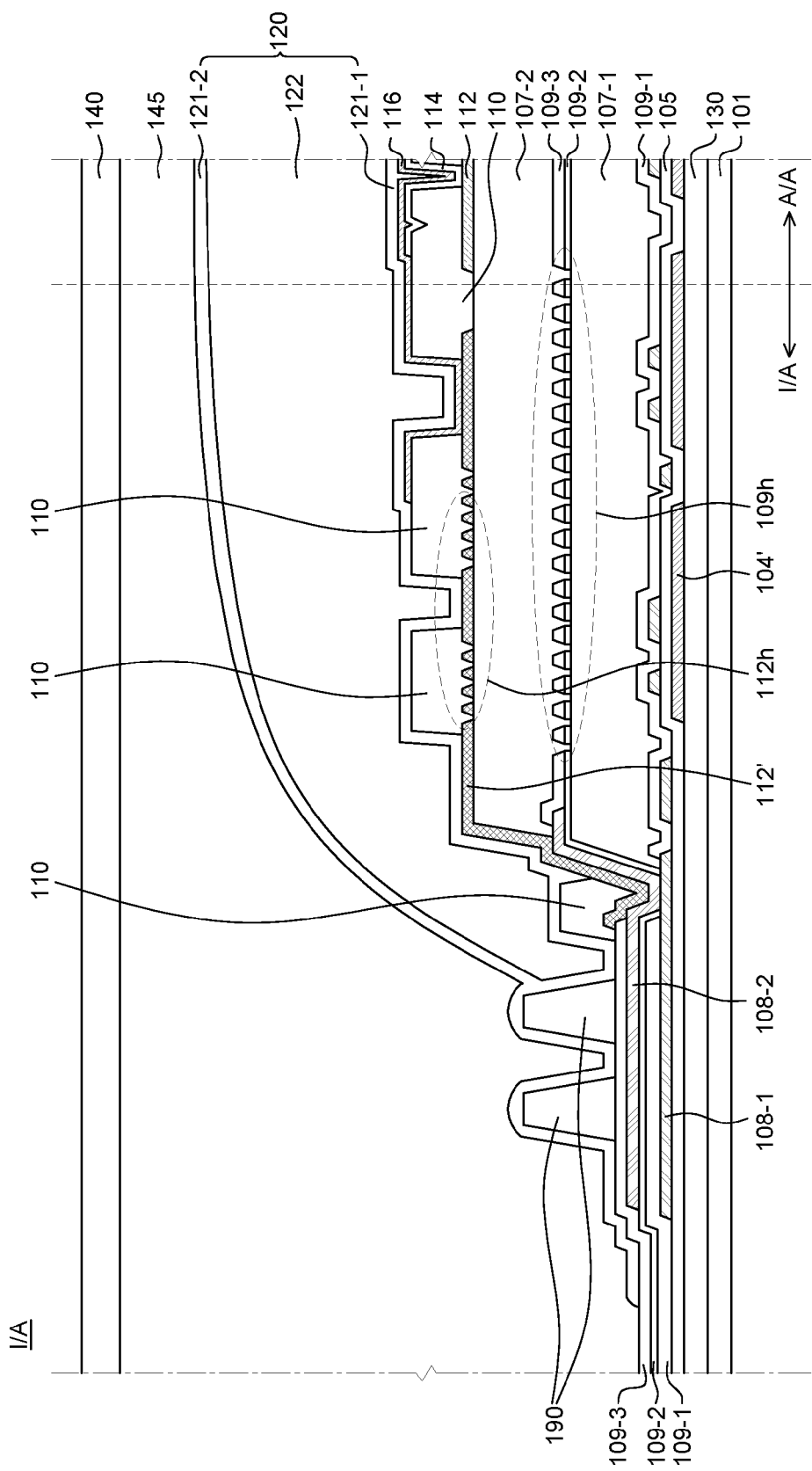
FIG. 3A to 3C are cross-sectional views illustrating an out-gassing structure applied to an inactive area of a display device according to an embodiment of the present disclosure.
Figure 3B:
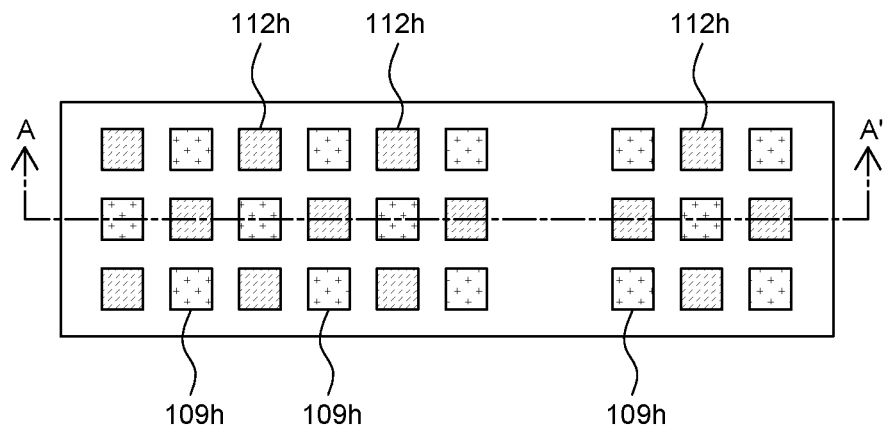
Figure 3C:
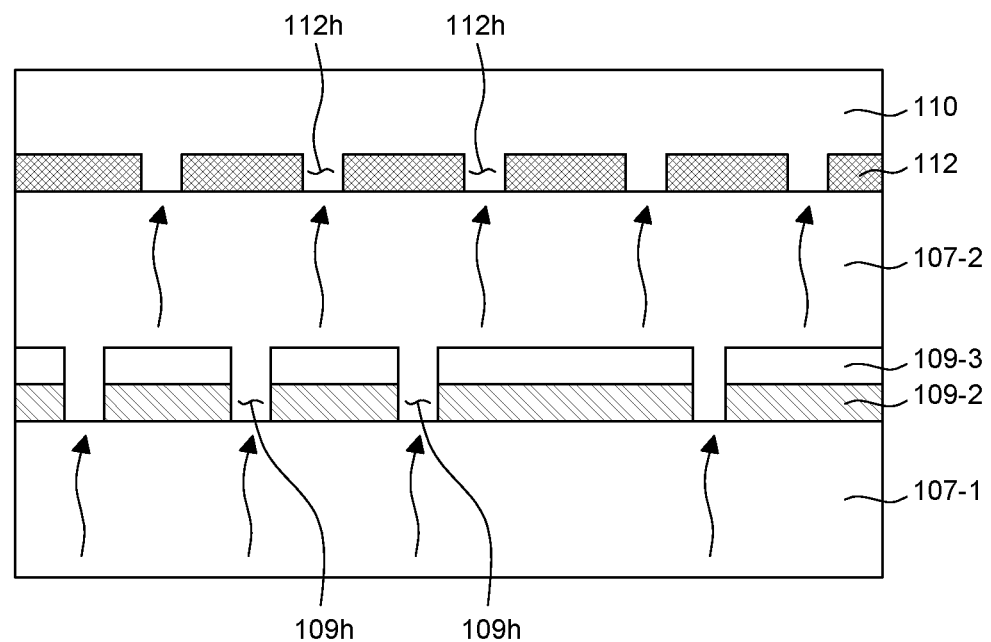

FIG. 3A to 3C are cross-sectional views illustrating an out-gassing structure applied to an inactive area of a display device according to an embodiment of the present disclosure.

FIG. 3A to 3C and FIG. 1 and FIG. 2 denote the same reference numerals with respect to the substantially the same elements, and thus, redundant features may be omitted merely for the sake of brevity.

As illustrated in said figures, the inactive area I/A may be located outside the active area A/A and a driving circuit (e.g., GIP), a power supply line and the like may be disposed thereon. Further, the inactive area may include structures 109h and 112h that allow out-gassing of residual gas from certain materials or layers within the display device.

The electrode/line connected to the driving circuit disposed in the inactive area can be made by the gate metal 104', the source/drain metal 108-1 and 108-2. The gate metal 104' is formed in the same process with the same material as the gate electrode of the TFT, and the source/drain metals 108-1 and 108-2 are formed in the same process with the same material as the source/drain electrodes of the TFT.

On the other hand, electric power can be supplied to the cathode 116 through the connection with the source/drain metals 108-1 and 108-2 and the anode metal 112'. Such connection structure is illustrated on the left side of FIG. 3A.

In an exemplary embodiment, the planarization layers are provided with two layers 107-1 and 107-2. Such design is to accommodate the structure with a greater number of signal lines for achieving a high resolution display as described above.

The first planarization layer 107-1 flattens the upper surface of various circuit elements (e.g., thin film transistors, capacitors, conductors, etc.) on the substrate. A protective layer 109-1 made of an inorganic material may be disposed between the first planarization layer 107-1 and the circuit element. On the first planarization layer 107-1, various functional metal layers may be disposed. In such case, inorganic layers 109-2 and 109-3 for passivation of the metal layers may be provided on the first planarization layer 107-1. The inorganic layers 109-2 and 109-3 may be in contact with the first planarization layer 107-1. For example, the inorganic layer may include a buffer layer 109-2 and a protective layer 109-3. That is, the metal layer may be disposed on the buffer layer 109-2 and covered by the protective layer 109-3.

The organic light emitting element 112, 114, and 116 may be disposed on the second planarization layer 107-2. In such case, a metal layer 112' connected to the organic light emitting element may be disposed on the second planarization layer 107-2.

The encapsulation layer 120 covers the upper portion of the organic light emitting element. The encapsulation layer may be made of an inorganic layer made of glass, metal, aluminum oxide (AlOx) or silicon (Si) based material, or alternatively may have a structure in which an organic layer and an inorganic layer are alternately stacked. FIG. 3A illustrates an encapsulation layer 120 in which inorganic layers 121-1 and 121-2 and an organic layer 122 are alternately stacked. The inorganic layers 121-1 and 121-2 serve to suppress permeation of moisture and oxygen, and the organic layer 122 serves to planarize the surfaces of the inorganic layers 121-1 and 121-2. The reason why the encapsulation layer is formed of a plurality of thin film layers is that it makes the permeation path of water or oxygen longer and more complicated than the single layer, hence it makes penetration of moisture and oxygen into the organic light emitting element more difficult.

The organic layer 122 has a certain degree of flowability, thus, it may be dispersed up to an edge of the inactive area during its application in the manufacturing process. Thus, the blocking structure 190 is arranged to control the spreading of the organic layer 122 in the inactive area I/A. Although two blocking structures (e.g., dams) are illustrated in FIG. 3A, the number of dam 190 can be one or more. Also, the dam 190 may be arranged to substantially or completely surround the active area A/A or may be disposed in the active area A/A. The dam 190 may be formed in multiple layers using at least one material. For example, the dam 190 can be made of the same material as the material used to form the bank 110 and/or the spacer.

The planarization layer may be made of an acrylic resin or the like. After the baking process, a gas or gaseous element such as hydrogen may remain within the planarization layer. Such residual gas, which can released over time, may affect the semiconductor layer of the thin film transistors (or other components), thereby undesirably causing the operating voltage of the thin film transistor to change. In addition, the residual gas may be permeated to the organic light emitting layer 114, thereby defects such as the formation of visible dark spots on the screen may occur. Therefore, it is important to remove the residual gas contained within the planarization layer as much as possible in order to improve the reliability and stability of the display device. Accordingly, the inventors of the present disclosure have devised an out-gassing structure capable of effectively exhausting residual gas contained in the planarization layer.

The out-gassing structure may include at least one among a first out-gassing pattern 109h on the first planarization layer 107-1 and a second out-gassing pattern 112h on the second planarization layer 107-2. That is, the structure may function as a gas discharge unit provided in the inorganic layer and/or the metal layer directly covering the planarization layer.

The first out-gassing pattern 109h may be provided in the inorganic layer on the first planarization layer 107-1, for example, such pattern may be provided in the buffer layer 109-2 and the protective layer 109-3. As described above, the buffer layer 109-2 and the protective layer 109-3 are functional layers provided for the metal layer on the first planarization layer 107-1. Although the inorganic material layers are illustrated as two layers in FIG. 3A, the inorganic material layer on the first planarization layer 107-1 may be configured as a single layer or at least three layers.

The second out-gassing pattern 112h may be provided on the metal layer 112' on the second planarization layer 107-2. The metal layer 112' may be in contact with the second planarization layer 107-2. The metal layer 112' may be a conductive material and may be in a same layer as a first electrode of an organic light emitting device. As described above, the metal layer 112' is a functional layer provided for electrical connection between the organic light emitting element and a driving circuit (e.g., a VDD/VSS supply circuit).

FIGS. 3B and 3C illustrate an example of a gas exhaust structure according to an embodiment of the present disclosure. Firstly, FIG. 3B is a plan view of the out-gassing structure. Accordingly, when viewed from above, at the boundary between the active area and the inactive area, the first out-gassing pattern 109h and the second out-gassing pattern 112h are arranged as illustrated in FIG. 3B. The shapes, sizes, and densities of the illustrated out-gassing patterns 109h and 112h are merely illustrative and the present disclosure is not limited thereto. That is, the shape of the out-gassing pattern may be a circle, an oval shape, or any polygonal shapes, and the first out-gassing pattern and the second out-gassing pattern may have different shapes and sizes.

For example, since the second out-gassing pattern 112h is provided in the metal layer, the out-gassing portion might be limited in consideration of its electrical resistance. On the other hand, since the first out-gassing pattern 109h is provided in the inorganic layer, there is no such limitations with respect to its electrical resistance. Therefore, the aperture ratio of the first out-gassing pattern 109h (e.g., the area of the gas exhausting hole) may be larger than the aperture ratio of the second out-gassing pattern 112h. In another embodiment, the first out-gassing pattern 109h and the second out-gassing pattern 112h may be provided so as not to overlap each other in the vertical direction as illustrated in FIGS. 3B and 3C.

FIG. 3C is a cross-sectional view taken along the line A-A' in FIG. 3B. As described above, the residual gas contained in the planarization layer is exhausted through the first out-gassing pattern (e.g., discharging hole) and the second out-gassing pattern (e.g., discharge hole).

FIG. 3A to 3C illustrate that the out-gassing patterns 109h and 112h are provided in the inactive area, the out-gassing pattern may be provided in at least one among the active area and the inactive area. That is, the out-gassing pattern may also be provided in the active area. Accordingly, in FIG. 4A to 4C, the out-gassing pattern provided in the active area will be described.

Figure 4A:
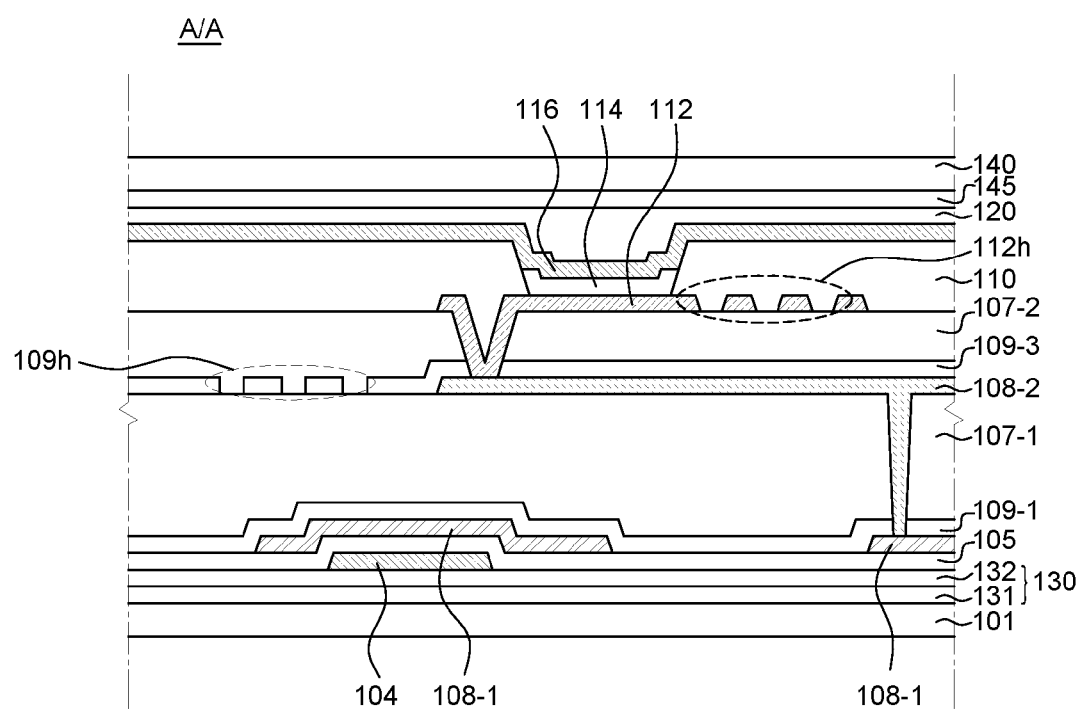
FIG. 4A to 4C are cross-sectional views illustrating an out-gassing structure applied to an active area of a display device according to an embodiment of the present disclosure.
Figure 4B:
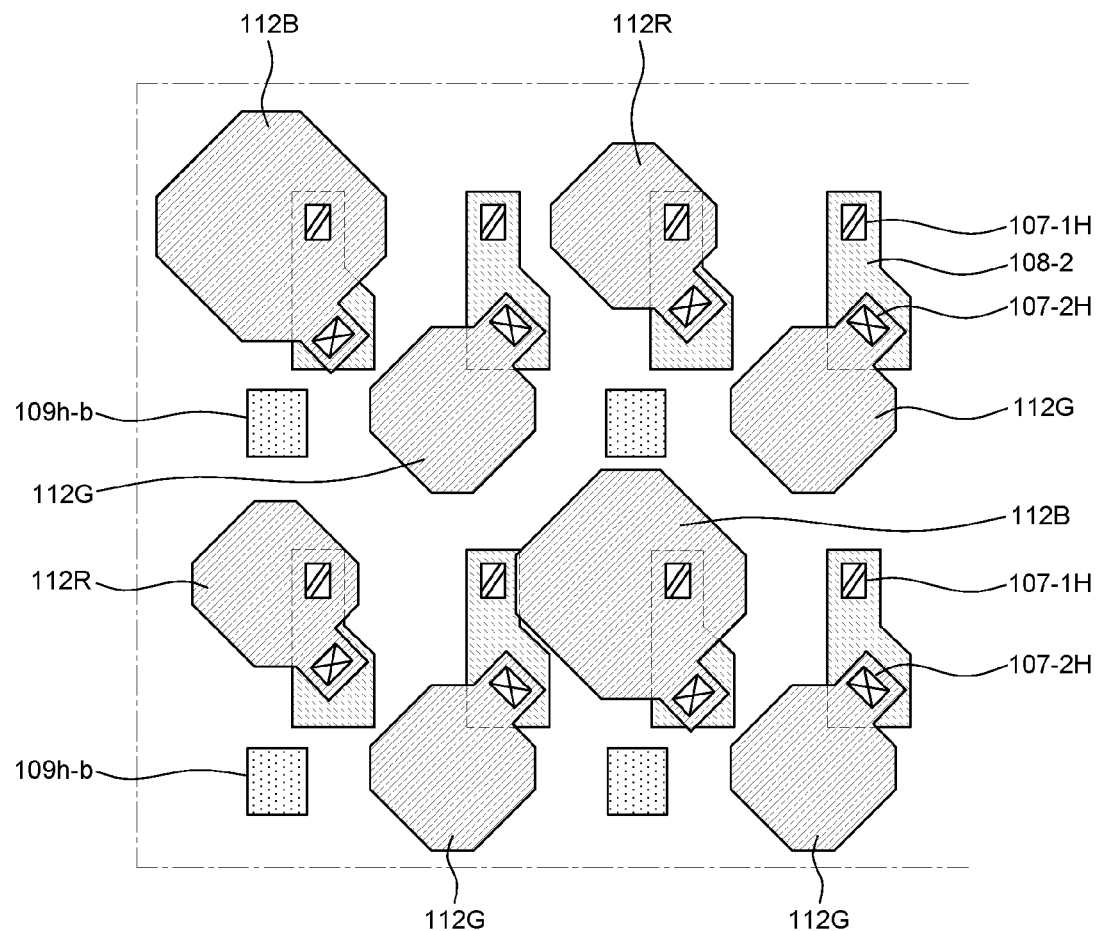
Figure 4C:
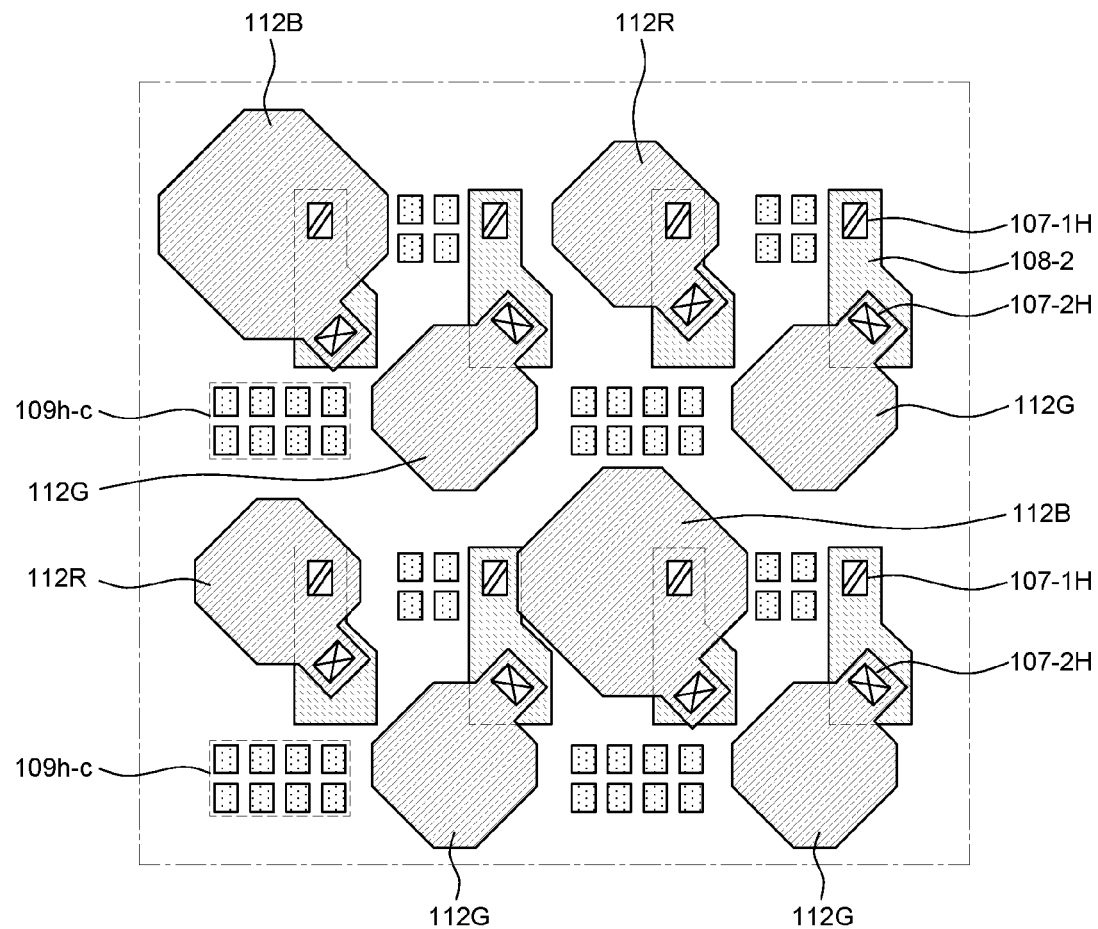

FIG. 4A to 4C are cross-sectional views illustrating an out-gassing structure applied to an active area of a display device according to an embodiment of the present disclosure.

In FIG. 4A to 4C, substantially the same elements as illustrated in FIGS. 1 to 3 are denoted by the same reference numerals, and the redundant features may have been omitted merely for the sake of brevity. The display device according to an embodiment of the present disclosure may include out-gassing patterns 109h and 112h in the active area A/A as well as the inactive area I/A. The out-gassing pattern has gas discharging holes provided in the inorganic layer and/or the metal layer directly covering the planarization layer. As an example, the out-gassing pattern includes at least one hole or opening region through the inorganic layer and/or the metal layer on the planarization layer. The gas discharge holes in the inorganic layer may extend through a buffer layer and a protective layer.

The out-gassing pattern may include at least one among ① a first out-gassing pattern 109h on the first planarization layer 107-1 and ② a second out-gassing pattern 112h on the second planarization layer 107-2.

The first out-gassing pattern 109h may be provided on an inorganic layer (e.g., a buffer layer, a protective layer or the like) on the first planarization layer 107-1. The first out-gassing pattern 109h is provided to allow the residual gas to be effectively discharged from the first planarization layer 107-1. Although the inorganic layer 109-3 is illustrated as a single layer in FIG. 4A, the inorganic layer on the first planarization layer 107-1 may include at least two layers. The first out-gassing pattern 109h may be provided on the inorganic layer 109-3 with a specific area ratio (e.g., 5 to 50%).

The planar shape of the opening region (i.e., a hole) included in the first out-gassing pattern 109h may be formed of a circular shape, an oval shape, a triangular shape, a rectangular shape or other polygonal shape, and its size, density and the like may be designed according to the specification of the display device (e.g., desired performance, screen size, product usage environment, etc.). For example, the out-gassing pattern 109h-b as illustrated in FIG. 4B has a rectangular opening shape with a larger planar area than the out-gassing pattern 109h-c as illustrated in FIG. 4C. On the other hand, the out-gassing pattern 109h-c as illustrated in FIG. 4C has relatively more rectangular openings than the openings of the out-gassing pattern 109h-b as illustrated in FIG. 4B, but also the sum of areas of the openings of the out-gassing pattern 109h-c is larger than the sum of areas of the openings of the out-gassing pattern 109h-b. When the openings of the first out-gassing pattern 109h is a square shape, the size may be 2×2 μm to 15×15 μm.

The first out-gassing pattern 109h may be disposed so as not to overlap with the metal layer 108-2 on the first planarization layer 107-1 in the horizontal and vertical directions. The metal layer 108-2 on the first planarization layer 107-1 may be a connection electrode, a signal line or the like.

The first out-gassing pattern 109h may be disposed so as not to overlap with a contact hole 107-1H passing through the first planarization layer 107-1 in the horizontal (row) and vertical (column) directions. The contact hole 107-1H may be formed to interconnect an element (e.g., a thin film transistor or the like) disposed under the first planarization layer 107-1 with an element (e.g., a connection electrode or a signal line) disposed on the first planarization layer 107-1, thereby a connection is provided.

The first out-gassing pattern 109h may be disposed so as not to overlap with the contact hole 107-2H passing through the second planarization layer in the horizontal and vertical directions. The contact hole 107-2H may be formed to interconnect an element (e.g., a connection electrode or a signal line) disposed under the second planarization layer 107-2 with an element (e.g., an anode) disposed on the second planarization layer 107-2, thereby a connection is provided. The first out-gassing pattern 109h may be disposed to avoid the first electrodes 112R, 112G, and 112B of the organic light emitting element.

The second out-gassing pattern 112h may be provided on the metal layer 112 on the second planarization layer 107-2. The metal layer 112 may be a first electrode (e.g., an anode). Since the second out-gassing pattern 112h is provided in the metal layer, its electrical resistance should be considered that may limit its portion. On the other hand, since the first out-gassing pattern 109h is provided in the inorganic layer, there is no such limitation. Therefore, the aperture ratio of the second out-gassing pattern 112h (e.g., the area of the gas exhausting hole) can be smaller than the first out-gassing pattern 109h. In addition, the second out-gassing pattern 112h and the first out-gassing pattern 109h may be provided so as not to overlap with each other in the vertical direction. On the other hand, the second out-gassing pattern may have a different shape and/or size from the first out-gassing pattern.

The out-gassing through the out-gassing pattern of the active area and/or the inactive area can be performed through the one-stage or the two-stage heat treatment process. The one-stage heat treatment process is a process that proceeds after formation of the metal layer including the out-gassing pattern on the second planarization layer 107-2. According to the two-stage heat treatment process, the first-stage is processed after formation of the inorganic layer including the out-gassing pattern on the first planarization layer 107-1. After the completion of the first-stage, second-stage is processed after formation of the metal layer including the out-gassing pattern on the second planarization layer 107-2.

That is, the residual gas can be effectively exhausted by providing the out-gassing pattern in the inactive area and/or the active area, when compared to a structure in which the\upper part of the first planarization layer 107-1 and/or the second planarization layer 107-2 are completely sealed, thereby the diffusion of the residual gas to the organic light emitting element can be significantly reduced. Therefore, the damage of the organic light emitting layer due to the residual gas is also reduced, and the problem of deterioration of the display quality can be solved.

The exemplary embodiments of the present disclosure can also be described as follows:

According to an aspect of the present disclosure, an organic light emitting display device may include a first planarization layer configured to planarize an upper portion of a circuit element on a substrate, an inorganic layer having a first out-gassing pattern on the first planarization layer, a second planarization layer configured to planarize an upper portion of the inorganic layer and a metal layer having a second out-gassing pattern on the second planarization layer.

The first out-gassing pattern and the second out-gassing pattern may be out-gassing holes provided to exhaust residual gas in the first and second planarization layers.

An aperture ratio of the first out-gassing pattern and an aperture ratio of the second out-gassing pattern may be different from each other.

The aperture ratio of the first out-gassing pattern may be larger than the aperture ratio of the second out-gassing pattern.

The first out-gassing pattern and the second out-gassing pattern may be provided so as not to overlap each other in a vertical direction.

The first out-gassing pattern and the second out-gassing pattern may be arranged in an inactive area.

The first out-gassing pattern may be also arranged in an active area.

The first out-gassing pattern may include at least one opening region passing through the inorganic layer on the first planarization layer.

The first out-gassing pattern arranged in the active area may be arranged so as not to overlap with the metal layer on the first planarization layer in a horizontal and a vertical direction.

The first out-gassing pattern arranged in the active area may be arranged so as not to overlap with a contact hole passing through the first planarization layer in a horizontal and a vertical direction.

The first out-gassing pattern arranged in the active area may be arranged so as not to overlap with a contact hole passing through the second planarization layer in a horizontal and a vertical direction.

The second out-gassing pattern may be also arranged in the active area.

The inorganic layer on the first planarization layer may include a buffer layer and a passivation layer.

The metal layer may be provided on the buffer layer and the passivation layer covers the metal layer on the buffer layer.

The metal layer on the second planarization layer may be provided to electrically connect an organic light emitting element and a driving circuit.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purpose only but not intended to limit the technical concept of the present disclosure. The features of various embodiments of the present disclosure can be partially or entirely bonded to or combined with each other and can be interlocked and operated in technically various ways as can be fully understood by a person having ordinary skill in the art and the embodiments can be carried out independently of or in association with each other.

The protective scope of the present disclosure should be construed based on the following claims and all the technical concepts in the equivalent scope thereof should be construed as falling within the scope of the present disclosure.

What is claimed is:

1. A display device comprising:
   a first planarization layer;
   a first layer on the first planarization layer and in contact with the first planarization layer;

a first outgassing pattern in the first layer, the first outgassing pattern comprising one or more gas discharge holes;

a second planarization layer covering the first layer;

a second layer on the second planarization layer and in contact with the second planarization layer; and a second outgassing pattern in the second layer, the second outgassing pattern comprising one or more gas discharge holes.

2. The display device of claim 1, wherein the first layer comprises two or more layers including a buffer layer and a protective layer, the gas discharge holes extend through the buffer layer and the protective layer.

3. The display device of claim 1, wherein the second layer is a conductive material.

4. The display device of claim 1, wherein the second layer is in a same layer as a first electrode of an organic light emitting device.

5. The display device of claim 1, further comprising a metal layer on the first planarization layer, wherein the first outgassing pattern does not overlap with the metal layer.

6. The display device of claim 1, wherein the first outgassing pattern does not overlap with any contact holes passing through the first planarization layer or any contact holes passing through the second planarization layer in a horizontal and a vertical direction.

7. The display device of claim 1, wherein the first outgassing pattern does not overlap with any organic light emitting diode anodes.

8. The display device of claim 1, wherein at least one of the first outgassing pattern and the second outgassing pattern is in an inactive area of the display device.

9. The display device of claim 1, wherein at least one of the first outgassing pattern and the second outgassing pattern is in an active area of the display device.

10. The display device of claim 1, wherein:
the second outgassing pattern does not overlap with the first outgassing pattern.

11. An organic light emitting display device comprising:
a first planarization layer configured to planarize an upper portion of a circuit element on a substrate;
an inorganic layer, having a first out-gassing pattern, on the first planarization layer;
a second planarization layer configured to planarize an upper portion of the inorganic layer; and
a metal layer, having a second out-gassing pattern, on the second planarization layer.

12. The organic light emitting display device of claim 11, wherein the first out-gassing pattern and the second out-gassing pattern are holes or openings provided to exhaust residual gas in the first and second planarization layers.

13. The organic light emitting display device of claim 11, wherein an aperture ratio of the first out-gassing pattern is larger than an aperture ratio of the second out-gassing pattern.

14. The organic light emitting display device of claim 11, wherein the first out-gassing pattern and the second out-gassing pattern are arranged in an inactive area and an active area.

15. The organic light emitting display device of claim 14, wherein the first out-gassing pattern includes at least one opening region extending through the inorganic layer on the first planarization layer.

16. The organic light emitting display device of claim 14, wherein the first out-gassing pattern arranged in the active area does not overlap with the metal layer on the first planarization layer in a horizontal and a vertical direction.

17. The organic light emitting display device of claim 14, wherein the first out-gassing pattern arranged in the active area does not overlap with a contact hole passing through the first planarization layer in a horizontal and a vertical direction.

18. The organic light emitting display device of claim 14, wherein the first out-gassing pattern arranged in the active area does not overlap with a contact hole passing through the second planarization layer in a horizontal and a vertical direction.

19. The organic light emitting display device of claim 11, wherein the inorganic layer on the first planarization layer includes a buffer layer and a passivation layer.

20. The organic light emitting display device of claim 11, wherein the metal layer on the second planarization layer electrically connects an organic light emitting element and a driving circuit.

* * * * *